United States Patent [19]

Duijves

[11] Patent Number: 5,091,641
[45] Date of Patent: Feb. 25, 1992

[54] HIGH-FREQUENCY OPTOELECTRIC FRONT-END

[75] Inventor: Pieter W. G. Duijves, Brussel, Netherlands

[73] Assignee: AT&T Bell Laboratories, Murray Hill, N.J.

[21] Appl. No.: 619,634

[22] Filed: Nov. 27, 1990

[30] Foreign Application Priority Data

Dec. 5, 1989 [NL] Netherlands ................. 8902992

[51] Int. Cl.$^5$ ............................. H01J 40/14
[52] U.S. Cl. ........................... 250/214 R; 307/311
[58] Field of Search ............... 250/214 R; 307/311; 455/608, 619

[56] References Cited

U.S. PATENT DOCUMENTS

| | | | |
|---|---|---|---|
| 3,557,373 | 1/1971 | Hess | 455/609 |
| 4,197,471 | 4/1980 | Lackey et al. | 307/311 |
| 4,306,145 | 12/1981 | Hill | 307/311 |
| 4,818,896 | 4/1989 | Ohmi et al. | 307/311 |
| 4,982,082 | 1/1991 | Ottusch | 250/214 R |

Primary Examiner—David C. Nelms
Assistant Examiner—S. Allen
Attorney, Agent, or Firm—James J. Trainor

[57] ABSTRACT

Optoelectric front-end comprising a photodiode which is not grounded and which drives a bipolar transistor acting as a feedback amplifier between the base and the emitter thereof, so that the d.c. arrangement of the transistor will cause no further noise to develop.

1 Claim, 1 Drawing Sheet

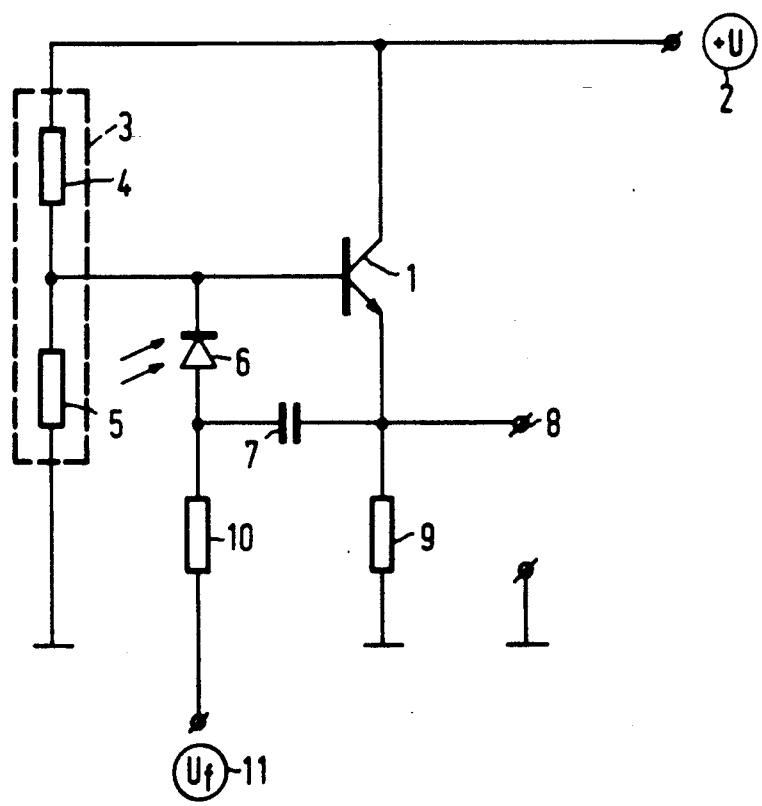

HIGH-FREQUENCY OPTOELECTRIC FRONT-END

The invention relates to a high-frequency optoelectric front-end for converting an optical signal into an electric signal by means of a photodiode arranged as a current source, which photodiode, via a capacitor, is connected in parallel with the base-emitter junction of a bipolar transistor arranged as a feedback amplifier, a main electrode of this transistor being connected to a side of a signal resistor which side forms the signal output of the front-end.

Such an optoelectric front-end is known from IEEE Journal of Quantum Electronics, Vol. QE-18, No. 10, Oct. 1982, the article entitled: "Optical Digital High-Speed Transmission; General Considerations and Experimental Results", pp. 1547-1558, more specifically, Page 1552, FIG. 7.

In the optoelectric front-end described in this article the cathode of the photodiode is connected via a capacitor to the base of a bipolar transistor and the anode is connected to the emitter of this transistor. The photodiode operates as a current source since it is arranged in a blocking configuration. In this configuration the collector is connected to the supply voltage by means of the signal resistor and the emitter is connected to ground. The transistor has a feedback by means of a base-collector resistor connected in parallel with a small capacitance. This small capacitance is present here in order to realise a frequency-dependent feedback.

The d.c. arrangement of this prior-art optoelectric front-end cannot be deduced from said article. This can simply be understood from the fact that the d.c. voltage difference caused by any d.c. base current would be much smaller (of the order of 1:1000) across the base-collector resistor than the d.c. voltage difference caused by the d.c. collector current would be across the signal resistor, if these resistors have values of the same order of magnitude. Consequently, the collector voltage would hardly be higher than the base voltage so that no more than an extremely small a.c. voltage swing on the collector would be possible.

A d.c. arrangement of this prior-art front-end would be conceivable in two prior-art fashions.

A first customary d.c. arrangement would be possible by using a resistive voltage divider connected to the supply voltage of the transistor and whose output is connected to the base. In this case the emitter would have to be connected to ground via a parallel connection of an emitter resistor and a large decoupling capacitor, and a blocking capacitor would have to be connected in series with the base-collector resistor as otherwise the d.c. arrangement would be affected via this base-collector resistor and the signal resistor.

A disadvantage of this possible configuration is that the resistances of the resistive voltage divider have to be large so as to maintain the noise currents developed in its resistors at a low level. Such large resistances present a poor noise behaviour due to their stray capacitance. Furthermore, a high supply voltage would be necessary, assuming that the d.c. current through the resistive voltage divider is required to be much larger (for example ten times) than the d.c. base current in order to restrict the effect of individual transistor variations on the d.c. arrangement. Besides, the capacitors allow of poor integration It is furthermore disadvantageous that the physical length of the feedback loop is enlarged by the blocking capacitor (at high frequencies of about 1 GHz an additional time delay of several nanoseconds already causes a considerable phase shift) and that the decoupling capacitor has always a parasitic inductance affecting the transfer at high frequencies.

A second customary d.c. arrangement would be feasible by connecting a parallel connection of a setting resistor and a decoupling capacitor in series with the base-collector resistor. The feedback is then still determined by the original base-collector resistor because the setting resistor is short-circuited for AC signals via the decoupling capacitor.

A detrimental effect of the above arrangement is that due to the fact that the current transfer ratio of the transistor varies in accordance with the individual transistor variation, the setting resistance per circuit will have to be adjusted in order to obtain the desired d.c. arrangement. In addition, when using the parallel connection, the physical length of the feedback loop will be enlarged. The setting resistor, which has a large value, and the decoupling capacitor further allow of poor integration.

It is an object of the invention to provide an optoelectric front-end whose d.c. arrangement provides a negligibly small contribution to the overall noise level and which does not have the detrimental effects mentioned hereinbefore (such as the need for additional capacitors, a higher supply voltage than is customary and a setting resistor that requires adjustment).

For this purpose, the optoelectric front-end according to the invention is characterised, in that the main electrode connected to a side of the signal resistor is the emitter and in that the front-end comprises a voltage divider a first side of which is connected to the collector of the bipolar transistor and a second side of which is connected to the other side of the signal resistor, the output of the voltage divider being connected to the base of the bipolar transistor.

Since in the front-end according to the invention each resistor already necessary for the a.c. transfer is also used for the d.c. arrangement, no additional resistors each causing additional noise need to be selected for this purpose.

The voltage divider resistor of the front-end according to the invention, which is located between the base and the collector, has a different value than the base-collector resistor of the prior-art front-end and has a function different therefrom. This can be simply understood because the former resistor is located between the input to the front-end and the supply voltage, whereas the latter resistor is located between the input to the front-end and the signal output.

A simple calculation shows that both said front-ends have the same a.c. transfer if the parallel value of the two resistors of the resistive voltage divider is equal to the base-collector resistor.

It should be observed that in the front-end according to the invention the photodiode (the signal source) is connected to the base and emitter of the transistor. So this is not an emitter-follower circuit in which the signal source is connected to the base and the grounded side of the emitter-resistor.

The invention will now be further explained with reference to an embodiment represented in the drawing FIGURE. The FIGURE shows the optoelectric front-end according to the invention.

The front-end represented in the FIGURE comprises a bipolar NPN transistor 1 whose collector is connected to the positive supply voltage 2. Between the supply voltage 2 and ground is inserted a resistive voltage divider 3 comprising the resistors 4 and 5 connected in series. The output of voltage divider 3 (the junction of the resistors 1 and 5) is connected to the base of transistor 1. The cathode of photodiode 6 is also connected to the base, whereas the anode of photodiode 6 is connected to the emitter of transistor 1 by means of a capacitor 7. This emitter forms the signal output 8 of the front-end and is connected to ground by means of signal resistor 9. By means of setting resistor 10 the anode of photodiode 6 is connected to a setting potential 11 which has a value and a polarity such that photodiode 6 is arranged in the blocked state and consequently arranged as the current source.

The front-end in the FIGURE according to the invention has the same a.c. transfer as the front-end of said IEEE Journal of Quantum Electronics if signal resistor 9 has the same value as the collector-resistor of the front-end of the IEEE Journal and if the value of parallel-connected resistors 4 and 5 is equal to the value of the base-collector resistor of the front-end of the IEEE Journal. The power gain is approximately equal to the value of signal resistor 9 divided by the value of the internal resistance of the emitter of the transistor.

The front-end represented in the FIGURE is advantageously adjusted for direct voltage: the resistors 4, 5 and 9, all having an a.c. function (feedback and signal resistance) likewise have a d.c. function (d.c. arrangement of the transistor). Consequently, no additional components are necessary for the d.c. arrangement, which components would then cause additional noise or introduce phase shifts as a result of their physical dimensions.

This configuration is possible because a photodiode can be used in a tri-state configuration, that is to say, without being grounded on one side.

I claim:

1. High-frequency optoelectric front-end for converting an optical signal into an electric signal by means of a photodiode arranged as a current source, which photodiode, via a capacitor, is connected in parallel with the base-emitter junction of a bipolar transistor arranged as a feedback amplifier, a main electrode of this transistor being connected to a side of a signal resistor which side forms the signal output of the front-end, characterised in that the main electrode connected to a side of the signal resistor is the emitter and in that the front-end comprises a voltage divider a first side of which is connected to the collector of the bipolar transistor and a second side of which is connected to the other side of the signal resistor, the output of the voltage divider being connected to the base of the bipolar transistor.

* * * * *

UNITED STATES PATENT AND TRADEMARK OFFICE
CERTIFICATE OF CORRECTION

PATENT NO. : 5,091,641
DATED : February 25, 1992
INVENTOR(S) : Pieter W.G. Duijves It is certified that error appears in the above-indentified patent and that said Letters Patent is hereby corrected as shown below:

On the title page, Item [73]: Assignee:

"AT&T Bell Laboratories, Murray Hill, N.J." should read --AT&T Network Systems International B.V., Hilversum, The Netherlands--.

Signed and Sealed this

Twenty-ninth Day of March, 1994

*Attest:*

BRUCE LEHMAN

*Attesting Officer*  *Commissioner of Patents and Trademarks*